US010096707B2

(12) United States Patent
Kim et al.

(10) Patent No.: US 10,096,707 B2
(45) Date of Patent: Oct. 9, 2018

(54) SEMICONDUCTOR STRUCTURE HAVING A JUNCTION FIELD EFFECT TRANSISTOR AND A HIGH VOLTAGE TRANSISTOR AND METHOD FOR MANUFACTURING THE SAME

(71) Applicant: Magnachip Semiconductor, Ltd., Cheongju-si (KR)

(72) Inventors: Young Bae Kim, Cheongju-si (KR); Kwang Il Kim, Cheongju-si (KR)

(73) Assignee: Magnachip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 15/915,105

(22) Filed: Mar. 8, 2018

(65) Prior Publication Data
US 2018/0197991 A1 Jul. 12, 2018

Related U.S. Application Data

(63) Continuation of application No. 14/942,527, filed on Nov. 16, 2015, now Pat. No. 9,947,786.

(30) Foreign Application Priority Data

Apr. 3, 2015 (KR) .................. 10-2015-0047731

(51) Int. Cl.
| | | |
|---|---|---|
| H01L 29/808 | (2006.01) |
| H01L 21/22 | (2006.01) |
| H01L 29/78 | (2006.01) |
| H01L 29/10 | (2006.01) |
| H01L 29/06 | (2006.01) |
| H01L 29/66 | (2006.01) |
| H01L 29/40 | (2006.01) |

(Continued)

(52) U.S. Cl.
CPC ...... *H01L 29/7832* (2013.01); *H01L 29/0649* (2013.01); *H01L 29/0688* (2013.01); *H01L 29/1058* (2013.01); *H01L 29/1066* (2013.01); *H01L 29/402* (2013.01); *H01L 29/41758* (2013.01); *H01L 29/66901* (2013.01); *H01L 29/808* (2013.01)

(58) Field of Classification Search
CPC .......... H01L 29/0653; H01L 29/41758; H01L 29/402–29/404; H01L 29/66893; H01L 29/0688; H01L 29/1066; H01L 29/808–29/8086; H01L 29/7832; H01L 2924/13062; H01L 27/14679
See application file for complete search history.

(56) References Cited

U.S. PATENT DOCUMENTS

| | | | | |
|---|---|---|---|---|
| 4,143,392 A * | 3/1979 | Mylroie | ............. | H01L 27/0716 257/273 |
| 5,191,401 A * | 3/1993 | Shirai | ................ | H01L 27/0922 257/328 |
| 5,306,944 A | 4/1994 | Beasom | | |

(Continued)

*Primary Examiner* — Maliheh Malek
(74) *Attorney, Agent, or Firm* — NSIP Law

(57) ABSTRACT

The present examples relate to a junction field effect transistor (JFET) that shares a drain with a high voltage field effect transistor. The present examples are able to control a pinch-off feature of the junction transistor while also maintaining electric features of the high voltage transistor by forming a groove on a lower part of a first conductivity type deep-well region located on a channel region of the junction transistor in a channel width direction.

18 Claims, 8 Drawing Sheets

US 10,096,707 B2
Page 2

(51) Int. Cl.
*H01L 29/417* (2006.01)
*H01L 21/38* (2006.01)

(56) References Cited

U.S. PATENT DOCUMENTS

| | | | |
|---|---|---|---|
| 6,011,283 A * | 1/2000 | Lee | H01L 27/0623 257/205 |
| 6,168,983 B1 | 1/2001 | Rumennik et al. | |
| 6,433,374 B1 * | 8/2002 | Fukunaga | H01L 27/14609 257/291 |
| 6,570,219 B1 * | 5/2003 | Rumennik | H01L 21/26 257/262 |
| 6,600,206 B2 | 7/2003 | Jeon et al. | |
| 6,825,700 B2 | 11/2004 | Hano | |
| 6,903,421 B1 * | 6/2005 | Huang | H01L 29/0634 257/335 |
| 6,995,428 B2 * | 2/2006 | Huang | H01L 29/0634 257/213 |
| 7,002,398 B2 | 2/2006 | Disney | |
| 7,064,407 B1 * | 6/2006 | Mallikarjunaswamy | H01L 27/0727 257/287 |
| 7,173,308 B2 * | 2/2007 | Kitaguchi | H01L 21/823857 257/335 |
| 7,205,824 B2 | 4/2007 | Disney | |
| 7,491,611 B2 | 2/2009 | Disney | |
| 7,560,808 B2 * | 7/2009 | Korec | H01L 24/14 257/691 |
| 7,605,428 B2 * | 10/2009 | Williams | H01L 21/761 257/335 |
| 7,629,645 B2 * | 12/2009 | Montanini | H01L 21/2652 257/330 |
| 7,812,402 B2 * | 10/2010 | Hatade | H01L 21/823814 257/168 |
| 7,851,314 B2 * | 12/2010 | Mallikarjunaswamy | H01L 21/26513 438/286 |
| 8,129,815 B2 | 3/2012 | Banerjee et al. | |
| 8,217,487 B2 | 7/2012 | Choi et al. | |
| 8,236,656 B2 | 8/2012 | Disney | |
| 8,575,531 B2 * | 11/2013 | Hynecek | H01L 27/1464 250/208.1 |
| 8,674,440 B2 * | 3/2014 | Korec | H01L 21/8234 257/341 |
| 8,786,016 B2 * | 7/2014 | Jang | H01L 29/7816 257/141 |
| 8,866,201 B2 | 10/2014 | Banerjee et al. | |
| 8,957,475 B2 * | 2/2015 | Moon | H01L 29/66681 257/335 |
| 9,024,381 B2 * | 5/2015 | Cho | H01L 29/66712 257/341 |
| 9,184,304 B2 * | 11/2015 | Kim | H01L 29/808 |
| 9,190,536 B1 * | 11/2015 | Chan | H01L 29/1058 |
| 9,214,457 B2 * | 12/2015 | Tsuchiko | H01L 21/8222 |
| 9,245,997 B2 * | 1/2016 | Hebert | H01L 29/7816 |
| 9,385,186 B2 * | 7/2016 | Li | H01L 29/7832 |
| 9,401,401 B2 * | 7/2016 | Hebert | H01L 29/1095 |
| 9,431,481 B2 * | 8/2016 | Lee | H01L 29/74 |
| 9,460,926 B2 * | 10/2016 | Mallikarjunaswamy | H01L 29/7823 |
| 9,520,492 B2 * | 12/2016 | Chan | H01L 29/7816 |
| 9,548,203 B2 * | 1/2017 | Kim | H01L 29/7816 |
| 9,673,323 B2 * | 6/2017 | Yeh | H01L 29/404 |
| 9,837,400 B2 * | 12/2017 | Mallikarjunaswamy | H01L 29/7823 |
| 2002/0050613 A1 * | 5/2002 | Rumennik | H01L 29/0619 257/325 |
| 2002/0113653 A1 * | 8/2002 | Emmerik | G05F 3/242 330/277 |
| 2004/0251497 A1 * | 12/2004 | Williams | H01L 21/26513 257/338 |
| 2005/0184338 A1 * | 8/2005 | Huang | H01L 29/0634 257/335 |
| 2005/0253201 A1 * | 11/2005 | Inoue | H01L 21/823892 257/386 |
| 2007/0158681 A1 * | 7/2007 | Kim | H01L 27/088 257/173 |
| 2007/0221963 A1 * | 9/2007 | Saito | H01L 27/098 257/256 |
| 2007/0278568 A1 * | 12/2007 | Williams | H01L 21/761 257/335 |
| 2008/0035987 A1 * | 2/2008 | Hebert | H01L 21/26586 257/330 |
| 2009/0111252 A1 * | 4/2009 | Huang | H01L 21/2253 438/530 |
| 2009/0261409 A1 * | 10/2009 | Tsai | H01L 29/0878 257/339 |
| 2010/0032731 A1 * | 2/2010 | Babcock | H01L 27/095 257/280 |
| 2010/0148254 A1 * | 6/2010 | Park | H01L 21/823462 257/337 |
| 2010/0301412 A1 * | 12/2010 | Parthasarathy | H01L 27/0629 257/337 |
| 2011/0080213 A1 * | 4/2011 | Tang | H01L 27/085 327/581 |
| 2011/0101454 A1 * | 5/2011 | Ichijo | H01L 29/063 257/339 |
| 2011/0156052 A1 * | 6/2011 | Malhan | H01L 29/1066 257/77 |
| 2011/0156682 A1 * | 6/2011 | Girdhar | H01L 27/0629 323/283 |
| 2011/0241083 A1 * | 10/2011 | Khemka | H01L 27/0705 257/262 |
| 2012/0043608 A1 * | 2/2012 | Yang | H01L 29/0653 257/336 |
| 2012/0104468 A1 * | 5/2012 | Li | H01L 29/0634 257/285 |
| 2012/0112277 A1 * | 5/2012 | Denison | H01L 21/823814 257/337 |
| 2012/0119331 A1 * | 5/2012 | Gendron | H01L 27/0262 257/587 |
| 2012/0187458 A1 * | 7/2012 | Knaipp | H01L 29/0692 257/256 |
| 2012/0273879 A1 * | 11/2012 | Mallikarjunaswamy | H01L 29/4175 257/335 |
| 2013/0009253 A1 * | 1/2013 | Wang | H01L 27/0629 257/379 |
| 2013/0069712 A1 * | 3/2013 | Trajkovic | H01L 29/66325 327/537 |
| 2013/0313617 A1 * | 11/2013 | Yeh | H01L 29/404 257/256 |
| 2013/0341718 A1 * | 12/2013 | Kim | H01L 29/402 257/342 |
| 2014/0035047 A1 * | 2/2014 | Korec | H01L 27/0629 257/368 |
| 2014/0061731 A1 * | 3/2014 | Chen | H01L 29/872 257/272 |
| 2014/0104888 A1 | 4/2014 | Banerjee | |
| 2014/0191281 A1 * | 7/2014 | Yamaji | H01L 27/088 257/139 |
| 2014/0197466 A1 * | 7/2014 | Chan | H01L 27/0705 257/262 |
| 2014/0197467 A1 * | 7/2014 | Hsu | H01L 21/76 257/272 |
| 2014/0211346 A1 * | 7/2014 | Gendron | H02H 9/046 361/56 |
| 2014/0231884 A1 * | 8/2014 | Yeh | H01L 29/404 257/285 |
| 2014/0246762 A1 * | 9/2014 | Kwon | H01L 21/266 257/653 |
| 2014/0367771 A1 * | 12/2014 | Chatty | H01L 29/0623 257/329 |
| 2015/0041892 A1 * | 2/2015 | Hebert | H01L 29/1095 257/339 |
| 2015/0041894 A1 * | 2/2015 | Hebert | H01L 29/7816 257/339 |
| 2015/0054038 A1 * | 2/2015 | Masliah | H03F 1/0266 257/262 |

(56) References Cited

U.S. PATENT DOCUMENTS

| | | | |
|---|---|---|---|
| 2015/0076600 A1* | 3/2015 | Jun | H01L 21/265 257/339 |
| 2015/0129977 A1* | 5/2015 | Chen | H01L 27/0277 257/390 |
| 2015/0137192 A1* | 5/2015 | Han | H01L 29/402 257/285 |
| 2015/0200295 A1* | 7/2015 | Prabhakar | H01L 29/7835 257/344 |
| 2015/0200309 A1* | 7/2015 | Karino | H01L 27/0248 257/272 |
| 2015/0311280 A1* | 10/2015 | Li | H01L 29/7832 363/49 |
| 2015/0325694 A1* | 11/2015 | Chan | H03K 17/687 327/434 |
| 2015/0380398 A1* | 12/2015 | Mallikarjunaswamy | H01L 29/7823 257/272 |
| 2016/0118378 A1* | 4/2016 | Wu | H01L 29/402 327/534 |
| 2016/0141369 A1* | 5/2016 | Kim | H01L 29/7816 257/655 |
| 2016/0141418 A1* | 5/2016 | Yeh | H01L 29/404 257/262 |
| 2016/0276339 A1* | 9/2016 | Titus | H01L 27/0705 |
| 2017/0084496 A1* | 3/2017 | Kim | H01L 29/7816 |
| 2017/0133505 A1* | 5/2017 | Han | H01L 29/808 |

\* cited by examiner

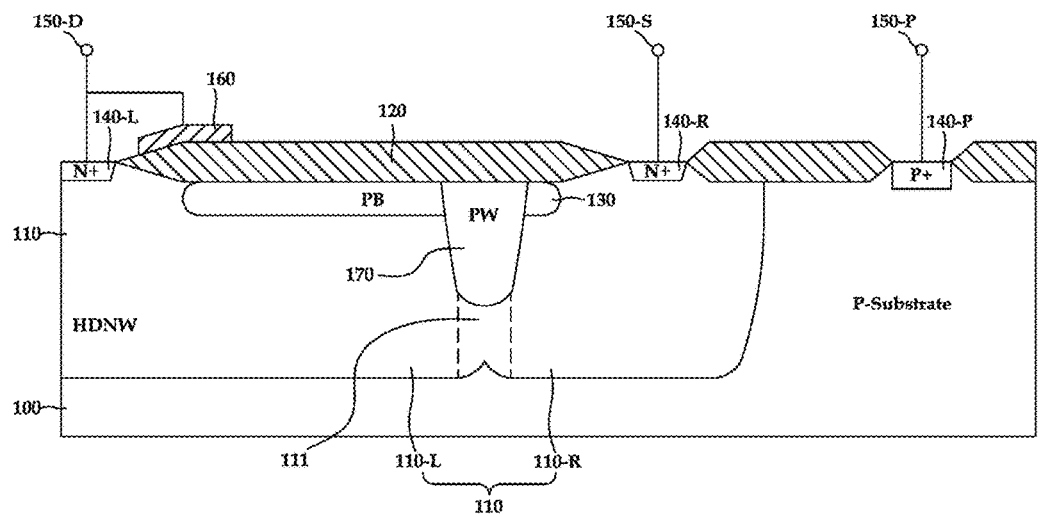
FIG. 6D
FIG. 7
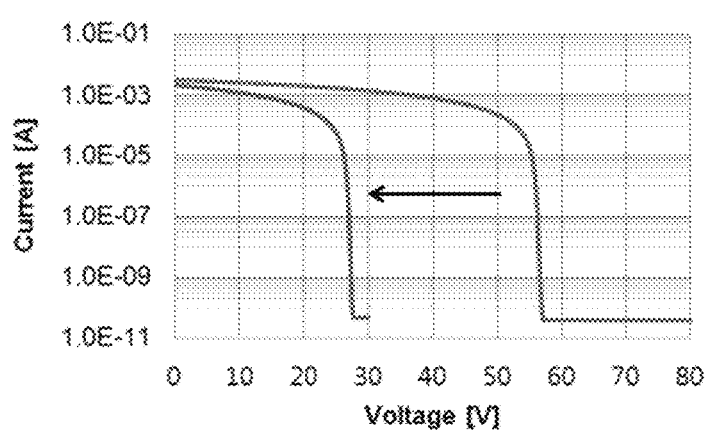

SEMICONDUCTOR STRUCTURE HAVING A JUNCTION FIELD EFFECT TRANSISTOR AND A HIGH VOLTAGE TRANSISTOR AND METHOD FOR MANUFACTURING THE SAME

CROSS-REFERENCE TO RELATED APPLICATIONS

This application is a Continuation of U.S. patent application Ser. No. 14/942,527 filed on Nov. 16, 2015, which claims the benefit under 35 USC 119(a) of Korean Patent Application No. 10-2015-0047731 filed on Apr. 3, 2015 in the Korean Intellectual Property Office, the entire disclosure of which is incorporated herein by reference for all purposes.

BACKGROUND

1. Field

The following description relates to a semiconductor device and a corresponding manufacturing method for the semiconductor device. For example, the semiconductor device includes high voltage field effect transistor and a JFET. The following description also relates to a semiconductor device and a manufacture method thereof with a junction transistor configured to control a pinch-off voltage and current.

2. Description of Related Art

A high voltage transistor is a device controlling passage of power having tens to hundreds of voltage associated with the power and performs switching of such a high voltage power. The high voltage transistor may include a high voltage Vbd that does not cause a breakdown to block a current in a turned-off status and may also include a small on-resistance Rsp value to reduce power loss in a turned-on status.

A junction field effect transistor (JFET) is a device included in such a controller of a high voltage power with the high voltage transistor. Further, the JFET may supply a start-up power to a circuit that controls a gate of the high voltage transistor. Generally, the circuit configured to control the gate of the high voltage transistor includes low voltage transistors, and thereby the junction transistor restricts a voltage and a current that are applied to the circuit so that they are not able to exceed a threshold through a pinch-off.

A high voltage transistor and a junction transistor according to an alternative approach use a substantial area to perform the aforementioned features. Accordingly, the high voltage transistor and the junction transistor have difficulties in minimization of size.

In an effort to solve the afore-mentioned problem an alternative approach uses a feature relating to a manufacturing method of a high voltage transistor including a high voltage transistor combined with a junction transistor. An on-resistance Rsp value may be reduced because an opposite conductivity type buried impurity layer is included in a drift drain region of a high voltage transistor of the above features.

However, the junction transistor of the above features uses a deep-well region that is used as a drift drain region of a high voltage transistor as a channel region of the junction transistor. Herein, a doping concentration of the deep-well region is determined according to the on-resistance Rsp of the high voltage transistor and a structure of a buried impurity layer is determined appropriately. Accordingly, the junction transistor of the above feature includes a channel region that is determined according to an electric feature of a high voltage transistor. Thus, there is an issue that respective control of current-voltage of the junction transistor is difficult.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The following description relates to a semiconductor device and manufacture method thereof with a junction transistor and a high voltage transistor feature that improves a degree of integration by minimizing an area.

Further, the following description relates to a semiconductor device and manufacture method with a junction transistor that may control a pinch-off feature of a junction transistor while maintaining an on-resistance (Rsp) feature of a high voltage transistor.

The junction transistor and a manufacture method thereof may improve a degree of integration by sharing a high voltage transistor and a drain.

Further, the junction transistor and the manufacture method thereof according to an embodiment of the following description may form a JFET gate region in a channel width direction on a first conductivity type deep-well region that is formed on a channel region. Thereby, an electric feature of a high voltage transistor is maintained and a pinch-off feature of a junction transistor may be controlled respectively.

In one general aspect, a semiconductor device includes a high voltage transistor and a junction field effect transistor (JFET) formed on a substrate, wherein the JFET includes a first conductivity type deep-well region comprising a diffusion region located on the substrate, a second conductivity type buried impurity layer located on the deep-well region, a first conductivity type common drain region located on the deep-well region, a first conductivity type first source region located on the deep-well region, a second conductivity type pick-up region formed on the substrate, and an insulating layer formed on the substrate between the first drain region and the first source region, wherein the diffusion region has an impurity concentration that is lower than other portions of the deep-well region.

The high voltage transistor may include a gate electrode located on the substrate, and a second source region located around the gate electrode, wherein the common drain region is located a certain distance apart from the gate electrode.

A groove may be located on a lower side of the diffusion region.

A pinch-off region may be located in the diffusion region.

The semiconductor device may further include a first terminal connected to the first drain region, a second terminal connected to the first source region, and a third terminal connected to the pick-up region, wherein
the first and second terminals are electrically connected to the deep-well region, the third terminal is electrically connected to the substrate, and in response to a first voltage being a voltage difference between the first terminal and the third terminal, a region of the deep-well may become a depletion region in response to the first voltage being the same or larger than the pinch-off voltage.

In response to the first voltage being smaller than the pinch-off voltage, the output voltage of the second terminal may be proportionate to the first voltage, and wherein in response to the first voltage being the same or larger than the pinch-off voltage, a voltage of the second terminal may become a fixed voltage.

The buried impurity layer may be formed to be in contact with a lower side of the insulating layer or may be formed separately in a vertical direction of a substrate surface.

The deep-well region may include a first deep-well region and a second deep-well region, and the diffusion region may be located between the first deep-well region and the second deep-well region and may be formed by an impurity diffusion of the first deep-well region and the second deep-well region.

The first deep-well region may have a higher doping concentration of an impurity than the second deep-well region and/or may be formed to be deeper than the second deep-well region.

The diffusion region may include a first deep-well region and a second deep-well region formed by ion injection of a first conductivity type impurity on the substrate using a mask pattern with a predetermined width, wherein the diffusion region may be formed through a thermal processing process that diffuses the first conductive type impurity.

In another general aspect, a semiconductor device includes a first conductivity type deep-well region located on a substrate, a second conductivity type buried impurity layer located on the deep-well region, a first conductivity type first drain region and a first source region located on the deep-well region, a second conductivity type first pick-up region located on the substrate, an insulating layer located on the substrate surface between the first drain region and the first source region, and a junction field effect transistor (JFET) gate region formed on a part of the deep-well region and formed to be in contact with a lower part of the insulating layer and formed to pass through the buried impurity layer.

The semiconductor device may further include a high voltage transistor located on the deep-well region, wherein the high voltage transistor includes a gate electrode, a second source region and a second pick-up region located on a side of the gate electrode, and a second drain region located separated by a certain distance from the gate electrode, wherein the first drain region and the second drain region are identical.

The JFET gate region and the second pick-up region may be electrically connected.

The semiconductor device may further include a first terminal connected to the first drain region; a second terminal connected to the first source region; and a third terminal connected to the pick-up region; wherein the first and second terminals are electrically connected to the deep-well region, the third terminal is electrically connected to the substrate, and in response to a first voltage being a voltage difference between the first terminal and the third terminal, one region of the deep-well becomes a depletion region in response to the first voltage being the same or larger than the pinch-off voltage, and in response to the first voltage being smaller than the pinch-off voltage, the output voltage of the second terminal is proportional to the first voltage and in response to the first voltage being the same or larger than the pinch-off voltage, a voltage of the second terminal becomes a fixed voltage.

In another general aspect, a semiconductor device includes a first conductivity type deep-well region having a first concentration located on a substrate, a first conductivity type semiconductor region having a second concentration that is lower than the first concentration and located in the deep-well region, a second conductivity type impurity layer that is located on the deep-well region, a first conductivity type drain region and a source region that are located separately from the semiconductor region, and a second conductivity type pick-up region located on the substrate, wherein a region of the second conductivity type impurity layer is in contact with the semiconductor region, and a pinch-off voltage is generated through the semiconductor region.

The deep-well region may include a first deep-well region and a second deep-well region, the first deep-well region and the second deep-well region may be located to be in contact with the semiconductor region, and the deep-well region may be formed when a first conductivity type dopant in the first deep-well region and the second deep-well region is diffused.

The semiconductor device may further include a JFET gate region formed to pass through the second conductivity type impurity layer.

In another general aspect, a junction field effect transistor (JFET) includes a deep-well region comprising a diffusion region located on a substrate, wherein the JFET also comprises a buried impurity layer, a common drain region, and a first source region located on the deep-well region and a pick-up region and an insulating layer located on the substrate, wherein the insulating layer is located on the substrate between the first drain region and the first source region, and wherein the diffusion region has an impurity concentration that is lower than other portions of the deep-well region.

The deep-well region, the common drain region, and the first source region may be of a first conductivity type and the buried impurity layer and the pickup-region are of a second conductivity type.

A groove may be located on a lower side of the diffusion region.

Other features and aspects will be apparent from the following detailed description, the drawings, and the claims.

BRIEF DESCRIPTION OF THE DRAWINGS

FIGS. 6A-6D illustrate a manufacturing method of a junction transistor according to an example.

FIG. 7 is a diagram illustrating a pinch-off of a junction transistor and a current feature curve.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
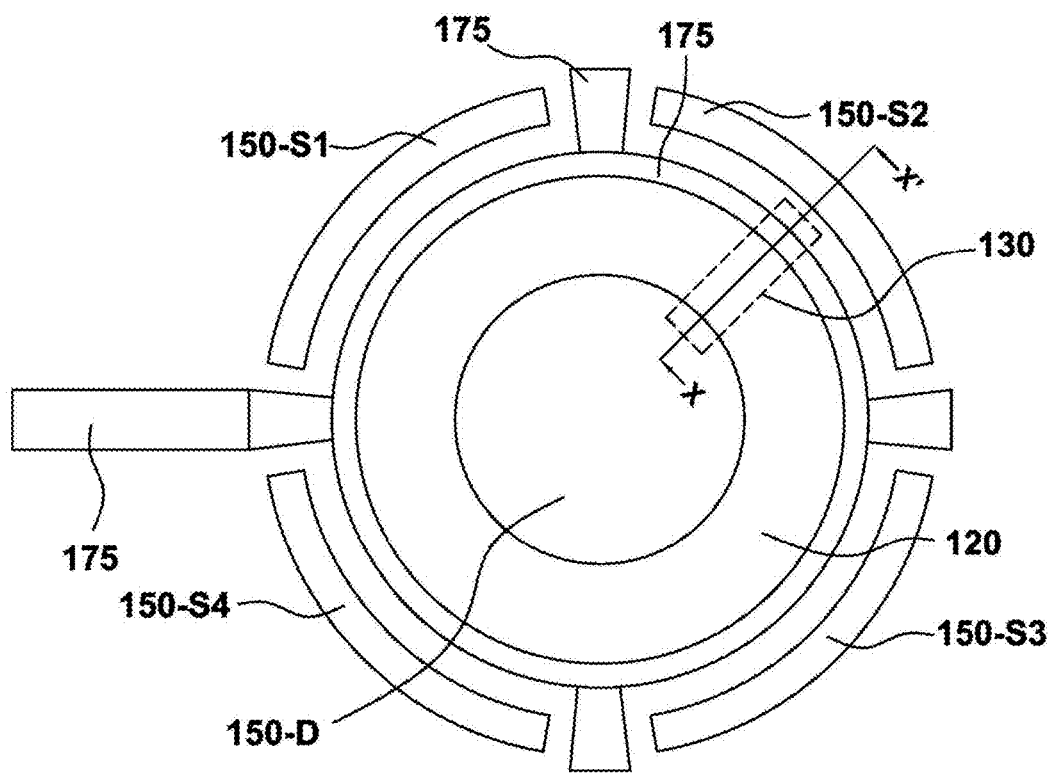
FIG. 1 is a diagram illustrating a junction transistor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in greater detail with reference to the accompanying drawings. In the following description, same drawing reference numerals are used for the same elements even in different drawings. The matters defined in the description, such as detailed construction and elements, are provided to assist in a comprehensive understanding of the present examples. Accordingly, it is apparent that the examples can be carried out without those specifically defined matters. Also, well-known functions or constructions are not described in detail since they would obscure the examples with unnecessary detail.

The following description relates to an example of the present description, with reference to the drawings.

FIG. 1 is a diagram illustrating a circular type multi-source JFET with a plurality of source electrodes 150-S1, 150-S2, 150-S3, 150-S4. In a center of the multi-source JFET, a drain electrode 150-D that is electrically connected to a drain region, not shown, is formed. Additionally, one P-type JFET gate 175 is formed surrounding the drain electrode 150-D. Further, a total of four source terminals 150-S1, 150-S2, 150-S3, 150-S4 that are connected to a source region, not shown, are formed in an outer direction of JFET gate 175. Additionally, a buried impurity layer 130 is formed below a drain electrode 150-D and a JFET gate 175. A cross-section at an X-X' standard line has a similar structure with the following example of FIG. 3A. The JFET gate 175 herein refers to a well region that is doped with a P-type dopant. Thus, when a potential difference between a drain electrode 150-D and a substrate, not shown, reaches a pinch-off voltage, the JFET gate 175 region is formed as a depletion region of a P-type substrate. Accordingly, a current may not increase anymore and may reach a saturation current. However, when a potential difference does not reach the pinch-off voltage, a voltage that corresponds to a voltage applied to a drain electrode 150-D is maintained in source terminals 150-S1, 150-S2, 150-S3, 150-S4. Thus, a current is applied according to the voltage applied to the drain electrode. However, there is a potential issue that occurs when using a high voltage transistor 20 and not changing a multi-source JFET junction transistor formed as above. That issue arises because a multi-source JFET junction transistor is formed to have a substantial area. Thus, although two transistors are combined, it is important to have an optimal area for the transistors.

Figure 2A:
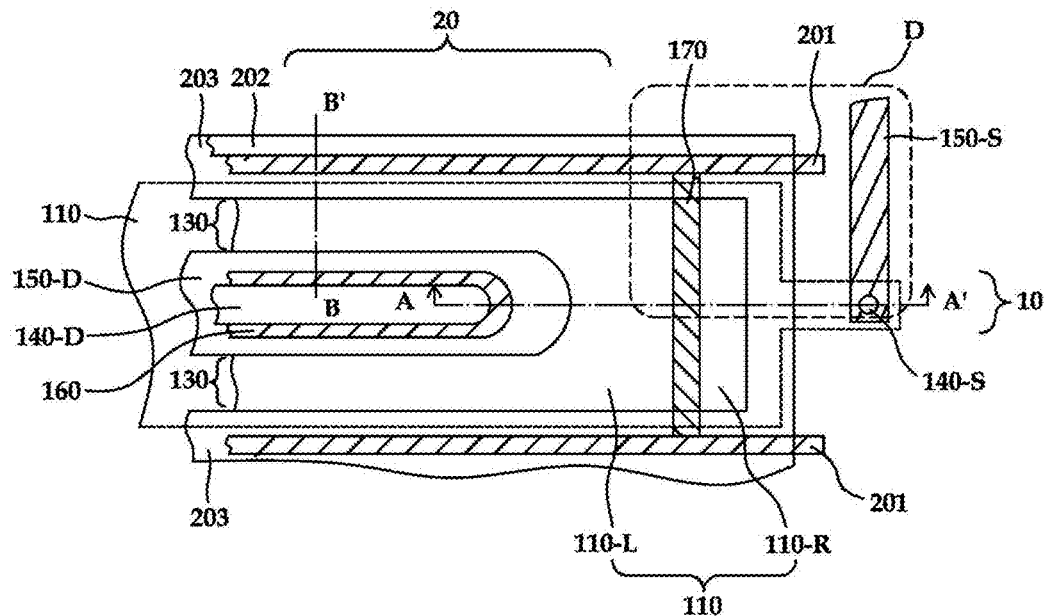
FIGS. 2A-2B are diagrams illustrating a plane view of a semiconductor device with a junction transistor and a high voltage transistor according to an example.
Figure 2B:
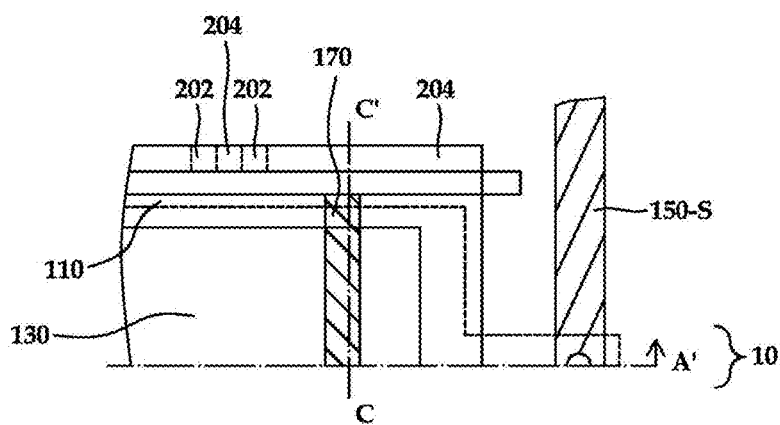

FIGS. 2A-2B are diagrams illustrating a plane view of a semiconductor device with a junction transistor and a high voltage transistor according to an example.

As illustrated in FIG. 2A, a semiconductor according to an example is formed with a junction transistor 10 and a high voltage transistor 20 formed together. Forming the junction transistor 10 and the high voltage transistor 20 together potentially reduces over 90% an area used in the chip, compared to a case of forming the high voltage transistor 20 and the junction transistor 10 separately for a low power application.

According to a A-A' standard line, the junction transistor 10 includes a deep-well region 110, a common drain region 140-D, a common drain electrode 150-D, a first source region 140-S and a first source electrode 150-S that is electrically connected to the first source region 140-S. The first source electrode 150-S is connected to a low voltage circuit, not shown, that is a different internal circuit. In the example of FIG. 2A, the deep-well region 110 includes a first deep-well region 110-L and a second deep-well region 110-R. The first deep-well region 110-L includes a drain region 140-D and the second deep-well region 110-R includes a source region 140-S. Further, a second conductivity type JFET gate region 170 is formed horizontally on a deep-well region 110. FIG. 3 further illustrates views relating to the second conductivity type JFET gate region 170.

Thus, in examples, according to the common drain region 140-D, a first source region 140-S of the junction transistor is formed in a direction perpendicular to a second source region 202 of a high voltage transistor. The above feature allows the high voltage transistor and a junction transistor to share the common drain region 140-D and the deep-well region 110, but also provides that the transistors are not required to be formed in a perpendicular orientation to each other.

The high voltage transistor 20 includes a gate electrode 201, the common drain region 140-D, the second source region 202, and a second source electrode 203 according to a B-B' standard line. Herein, the high voltage transistor 20 is formed on a deep-well region 110 of the junction transistor 10. The common drain region 140-D is a region identical to the common drain region 140-D of the junction transistor 10. Accordingly, the high voltage transistor 20 and the junction transistor 10 share the drain region 140-D and the deep-well region 110.

FIG. 2B is a diagram showing an enlarged view of the "D" region displayed in FIG. 2A. In the example of FIG. 2B, a gate electrode 201 of a high voltage transistor is formed around a JFET gate region 170. Further, a second source region 202 with an N+ concentration and a second pick-up region 204 with a P+ concentration are repeatedly formed around a gate electrode 201 to prevent forming a parasite diode by a hole carrier. If a second pick-up region 204 is placed further away from the gate electrode 201 than the second source region 202, a time of the hole carrier placed in a P-type body region 206 increases. As a result, a potential difference by a hole carrier increases. Thus, a parasite diode that is not wanted is potentially formed. The second pick-up region 204 is formed on an extending line of the JFET gate region 170 to electrically connect the JFET gate region 170 with a second pick-up region 204 of a high voltage device. Accordingly, the JFET gate region 170 has a potential difference with the second pick-up region 204 of the high voltage device. When the P+ pick-up region 204 has a reference ground voltage, the JFET gate region 170 does not float electrically and has a reference ground voltage and is potentially floating with an electrically connection to each other according to an example.

Figure 3A:
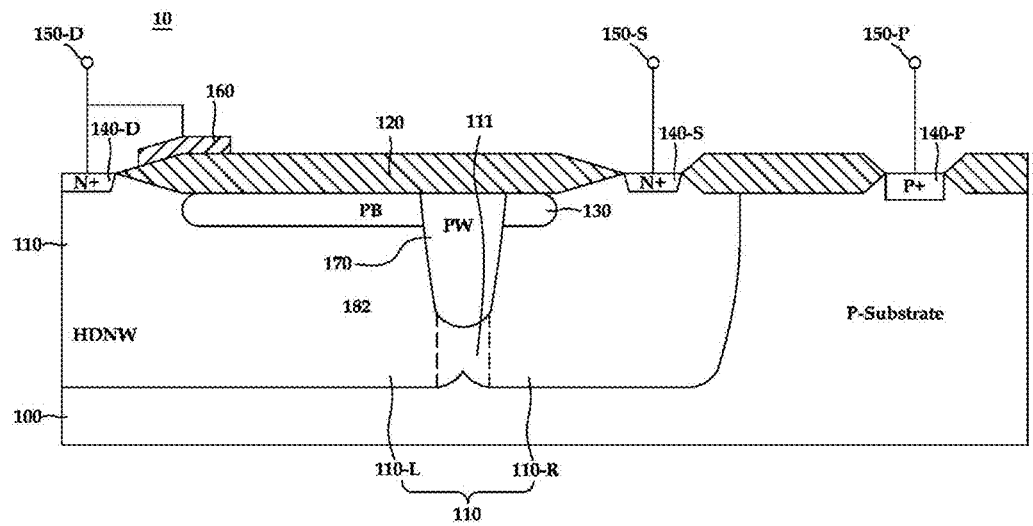
FIGS. 3A-3C are diagrams illustrating a schematic view of a semiconductor device including a junction transistor and a high voltage transistor according to an example.
Figure 3B:
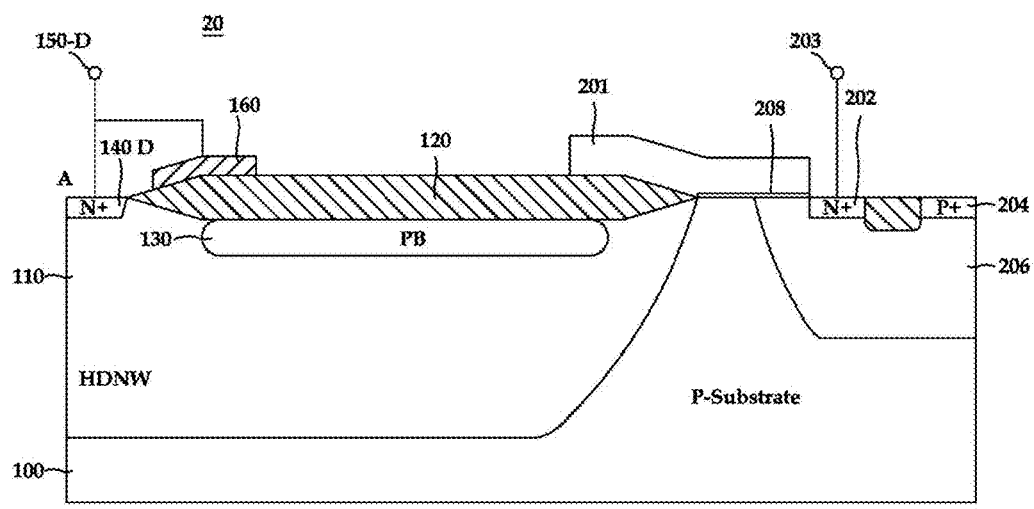
Figure 3C:
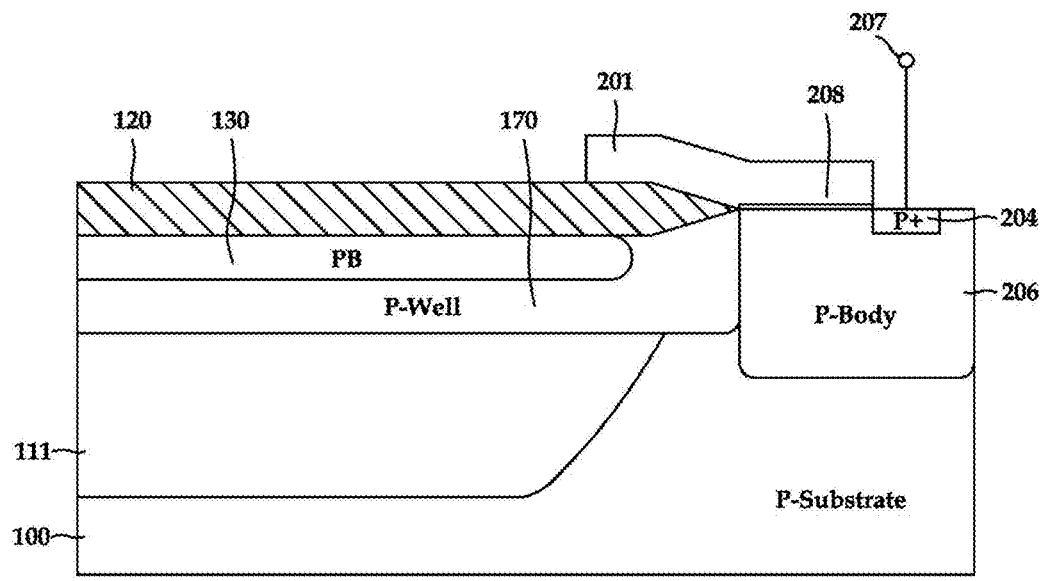

FIGS. 3A-3C are cross-sections of a semiconductor device according to an example.

First, FIG. 3A is a cross-section of the A-A' line of FIG. 2. As illustrated, the junction transistor 10 according to an example is formed in a first conductivity type deep-well region 110 that is formed inside a P-type substrate 100. Further, a common drain region 140-D and a first source region 140-S are formed in a deep-well region 110 and an insulating layer 120 is formed on a substrate 100 surface between the drain region 140-D and a source region 140-S. A second conductivity type buried impurity layer 130 forms a certain side in a horizontal direction of a surface of the substrate 100 in the deep-well region 110. In FIG. 3A, a field plate 160 is formed on an insulating layer 120 adjacent to a drain region 140-D. A common drain electrode, or a first terminal, 150-D that is electrically connected to the field plate 160 and the drain region 140-D is included. A source electrode, or a second terminal, 150-S that is electrically connected to the first source region 140-S is included. The terminals herein 150-D, 150-S are formed in a metal wire. Further a P-type first pick-up region 140-P is formed on a substrate 100. Additionally, a pick-up electrode, or a third terminal, 150-P that is electrically connected to a P-type first pick-up region 140-P is formed. A third terminal 150-P and a P-type substrate 100 are connected with a ground reference voltage. An output voltage of the first source electrode 150-S is determined according to a voltage difference between the substrate 100 and the common drain region 140-D.

The deep-well region 110 includes a first deep-well region 110-L and a second deep-well region 110-R. In this example, the first deep-well region 110-L includes a common drain region 140-D and the second deep-well region 110-R includes the first source region 140-S. Further, a diffusion region 111 is formed between the first and second deep-well regions 110-L, 110-R which are formed by diffusion of ion-injected dopants of the first deep-well region 110-L and the second deep-well region 110-R. The diffusion region 111 is a region in which a depletion region is formed, according to a potential difference between a substrate and a common drain region. In other words, a diffusion region includes a pinch-off region. Further, the diffusion region includes a concave groove H. The groove H is part of a manufacturing process of a junction transistor 10. Thus, the diffusion region 111 provides that a region of the first deep-well region 110-L and the second deep-well region 110-R are adjacent. A bottom side of a groove H of a diffusion region 111 is formed further to be lower than a depth of a bottom side of a first and a second deep well region 110-L, 110-R. The first and second deep-well regions 110-L, 110-R are formed with an identical impurity concentration and depth. However, a diffusion region 111 with a groove has an impurity concentration that is lower than that of the first and second deep-well regions 110-L, 110-R and the bottom side depth of the diffusion region is identical or smaller at least than that of the first and second deep-well regions 110-L, 110-R.

In an example, an insulating film 120 is a field insulating film and is formed using a Local Oxidation of Silicon (LOCOS) process or a Shallow Trench Isolation (STI) process.

A buried impurity layer 130 forms a consistent side layer along a horizontal direction of a substrate surface in a deep-well region 110 and a second conductivity type impurity is doped in the buried impurity layer 130. For example, a buried impurity layer 130 is formed all over the first deep-well region, the second deep-well region and a depletion region. Thus, a buried impurity layer 130 is formed to be in contact with a bottom side of an insulating layer 120. The junction transistor 10 according to an example has a channel disappear between the buried impurity layer 130 and the insulating film 120 and only an N-type channel region 182 below a buried impurity layer 130 remains. For example, at least one buried impurity layer 130 is formed to be separated in a vertical direction of a substrate surface and affects a breakdown voltage Vbd and an on-resistance Rsp feature according to a number of buried impurity layer 130 elements. The buried impurity layer 130 is electrically connected to a P-type substrate 100. The buried impurity layer 130 has a ground reference voltage like the P-type substrate 100.

A second conductivity type JFET gate region 170 is formed in the deep-well region 110 and is in contact with a lower part of the insulating film 120 and passes through the second conductivity type buried impurity layer 130. The pinch-off voltage is further decreased by the JFET gate region 170 because a P-type region further increases in size compared to when there is only a second conductivity type buried impurity layer 130. In this example, JFET junction region 170 is a junction gate. When the JFET gate region 170 is applied with a reverse bias, at the JFET gate region 170, the depletion region is extended to the substrate 100 region and enters in contact with the P-type substrate 100. Thereby, a pinch-off, that is, a rapid increase of resistance of a deep-well region 110, is generated. However, when the pinch-off voltage is generated, an extended region 111 that is below a second conductivity-type well 170 becomes a channel region and applies an appropriate amount of current. Further, the JFET gate region 170 is formed on the diffusion region 111 of a junction transistor 10 and reduces a cross-section area of the diffusion region 111 as a result. In other words, the area of the diffusion region 111 of the junction transistor decreases because the diffusion region 111 is formed on the upper part of the JFET gate region 170, and thereby the pinch-off voltage also accordingly decreases. Thus, the JFET gate region 170 is electrically connected to the substrate and has a ground reference voltage.

When a reverse bias is applied between a drain region 140-D and a substrate 100, a depletion region between the substrate 100 and the deep-well regions 110, 111 and a depletion region between the deep well regions 110, 111 and a buried impurity layer 130 are extended respectively. When a voltage difference between a first terminal 150-D and a substrate 100 reaches a pinch-off voltage, the extended depletion regions potentially contact each other. However, in an example, a distance between the buried impurity layer 130 and a P-type substrate 100 includes an N-type diffusion region 111 with a groove that is shorter than an N-type first and second deep well regions 110-L, 110-R without a groove H. Further, the diffusion region 111 has a net doping concentration lower than that of the first and second deep-well regions 110-L, 110-R. Accordingly, the diffusion region with a groove H changes into a depletion region faster than a different region of deep well regions 110-L, 110-R and the diffusion region 111 with a groove first reaches the pinch-off. In other words, the pinch-off region has a lowest doping concentration among deep well regions 110, 111 and is formed on the diffusion region 111 with a narrow cross-sectional area. The diffusion region 111 is included in a channel region of the junction transistor 10, and thereby all portions of diffusion region 111 become a depletion region, as the junction transistor reaches the pinch-off.

Further, since the JFET gate region 170 is reducing the area of the diffusion region 111, reaching the pinch-off occurs faster than without the JFET gate region 170. Also, the higher a concentration of the JFET gate region 170 is, the further a pinch-off voltage is expected to decrease. Accordingly, controlling the concentration of the JFET gate region 170 controls the pinch-off voltage. Likewise, controlling a depth of the JFET gate region 170 also controls the pinch-off voltage.

When a pinch-off voltage is generated in the diffusion region 111, a resistance of an N-type deep-well region 110, 111 between a first terminal 150-D and a second terminal 150-S rapidly increases, and thereby a voltage of the second terminal no longer increases and it stays at a certain pinch-off voltage. When the second terminal 150-S does not reach a pinch-off voltage, the voltage of the second terminal 150-S increases according to the voltage of the first terminal 150-D. However, when reaching the pinch-off voltage, the second terminal 150-S stays at the pinch-off voltage, although the voltage of the first terminal 150-D continues to increase. Accordingly, the junction transistor 10 restricts an amount of current so that the second terminal 150-S does not exceed a certain voltage. By restricting the current in this manner, it may protect an internal circuit that is connected to the second terminal 150-S from a high voltage of the first terminal 150-S. Thus, the junction transistor 10 uses a pinch-off phenomenon to restrict a voltage and a current that are applied to the internal circuit from exceeding a threshold.

To sum up, when a voltage difference between the first terminal 150-D and a third terminal 150-P is smaller than the pinch-off voltage, an output voltage of the second terminal 150-S is proportional to the above voltage difference. However, when the voltage difference is the same or bigger than the pinch-off voltage, a pinch-off is generated and thus, the voltage of the second terminal 150-S becomes a fixed voltage.

A field plate 160 is formed using a metal or a polycrystalline silicon material. Further, the field plate 160 relieves an electric field and prevents a breakdown phenomenon as the electric field is thereby concentrated locally.

FIG. 3A illustrates a structure of an N-type junction transistor as an example, however a skilled person of a related field would optionally apply a similar principle to a related structure based on a P-type junction transistor.

Further referring to FIG. 3A, when a second conductivity type deep-well region 110 formed on a substrate has a first concentration, the diffusion region 111 has a second concentration that is lower than the first concentration. Moreover, the junction transistor 10 according to an example is a junction transistor with a pinch-off generated through the semiconductor region, that is, a diffusion region, 111. The first and second deep-well regions have a first concentration. The first deep-well region and the second deep-well region are formed to be in contact with the semiconductor region 111. A first conductivity type dopant is diffused on the first deep-well region and the second deep-well region, and thereby the deep-well regions are formed. Further, a drain region 140-D and a source region 140-S are separated with the diffusion region 111 in a predetermined space that is a part region of a buried impurity layer 130, doped with a first conductivity type impurity, in contact with the diffusion region 111.

Moreover, FIG. 3B illustrates a cross-section of a high voltage transistor 20 according to a B-B' reference line of FIG. 2A. The high voltage transistor 20 includes a deep-well region 110 and a buried impurity layer 130 formed in the deep-well region 110. In the example of FIGS. 3A and 3B, the deep-well region 110 is a first deep-well region 110-L of the junction transistor 10. Further, the deep-well region 110 includes a common drain region 140-D formed in the deep-well region 110, a common drain electrode 150-D formed in the upper part of the common drain region 140-D, and a field plate 160 formed on an insulating film 120.

Moreover, the deep well region 110 includes a P-type body region 206 formed on a P-type substrate 100, a second source region 202 with an N+ concentration, a second pick-up region 204 with a P+ concentration, a gate insulating film, a gate electrode 201 and a second source electrode 203. The second source region 202 and the pick-up region 204 in this example are formed in the P-type body region 206. In this example, the second source region 202 and the second pick-up region 204 are electrically connected by a separation process, respectively. In order to achieve this effect, the second source region 202 and the second pick-up region 204 are formed by separating these regions from an insulating film of LOCOS and so on.

Next, FIG. 3C is a diagram illustrating a cross-section of a junction transistor 10 and a high voltage transistor 20 according a CC' reference line suggested in the example of FIG. 2B. A buried impurity layer 130 is formed in contact with an insulating film 120 and a JFET gate region 170 is formed surrounding the buried impurity layer 130. Also, a P-type body region 206 is formed that is in contact with the JFET gate region 170 and a second pick-up region 204 with a P+ dopant concentration is also formed. Thus, the JFET gate region 170 and the second pick-up region 204 are electrically connected with each other. Additionally, the gate insulating film 208 and a gate electrode 201 are formed on the P-type body region 206. In this example, the P-type body region 206, the gate insulating film 208 and the gate electrode 201, as well as the second pick-up region 204, are identical with the corresponding elements in the illustration of FIG. 3B. Here, the JFET gate region 170 is formed to extend below a gate electrode 201 of a high voltage transistor. A gate electrode 201 of a high voltage transistor and the JFET gate region 170 overlap. Here, the diffusion region 111 of the junction transistor 20 is formed below the JFET gate region 170. The JFET gate region 170 is in contact with not only a P-type body region 206 but also a P-type substrate 100.

Figure 4A:
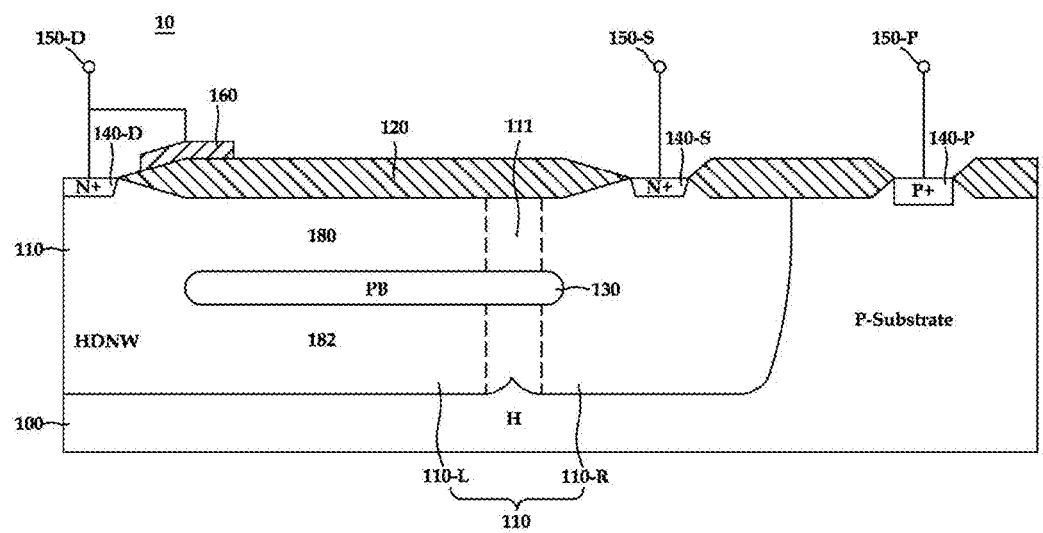
FIGS. 4A-4B and 5A-5B are diagrams illustrating a junction transistor according to an example.
Figure 4B:
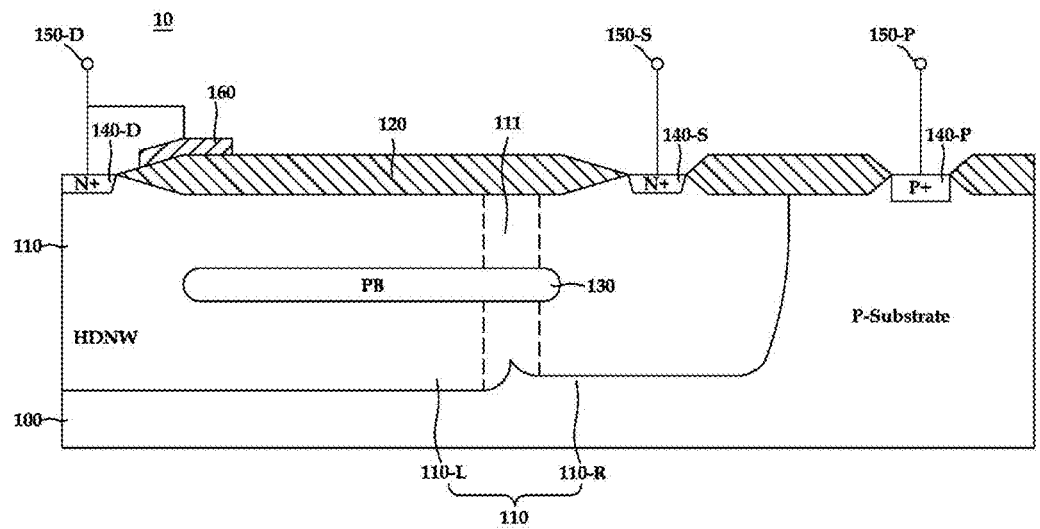

FIGS. 4A-4B illustrate a junction transistor according to an example, with reference to a diagram shown with reference to A-A' of FIG. 2.

First, as illustrated in FIG. 4A, the junction transistor 10 according to an example includes a buried impurity layer 130 formed separately in a certain space with an insulating layer 120. Thus, a deep-well region 110 formed between a drain region 140D and a source region 140-S is separated into an upper part 180 and a lower part 182. This approach means a channel region of the junction transistor 10 is separated into two portions. Since the buried impurity layer 130 is separated from the insulating layer 120, a region between the buried impurity layer 130 and the insulating layer 120 is obtained. Therefore, in a situation in which two regions are in contacting with each other, a current route lengthens. By contrast, when the two regions are separated, the current route shortens. Thus, an amount of current flowing between the source region 140-S and the drain region 140-D increases when compared to the previous approaches.

FIG. 4B illustrates a junction transistor 10 according to an example. As illustrated in FIG. 4B, the junction transistor 10 according to an example includes the feature that an impurity concentration or a depth of first and second deep-well regions 110L, R are different from one another. As aforementioned, in an example, the second deep-well region 110-R controls a concentration and a depth of an impurity according to an electric feature that is appropriate for a junction transistor 10 since a portion of the second deep-well region that is used as a drift drain region of a high-voltage transistor is small. Thus, a depth of the second deep-well region 110-R is formed to be shallower than the first deep-well region 110-L. In this manner, a cross-section of a channel region is potentially reduced. Further, the pinch-off voltage and current are controlled by reducing an impurity concentration of the second deep-well region 110-R. A structure illustrated in FIG. 4 potentially has a lower pinch-off voltage than a structure illustrated in FIG. 4A.

Figure 5A:
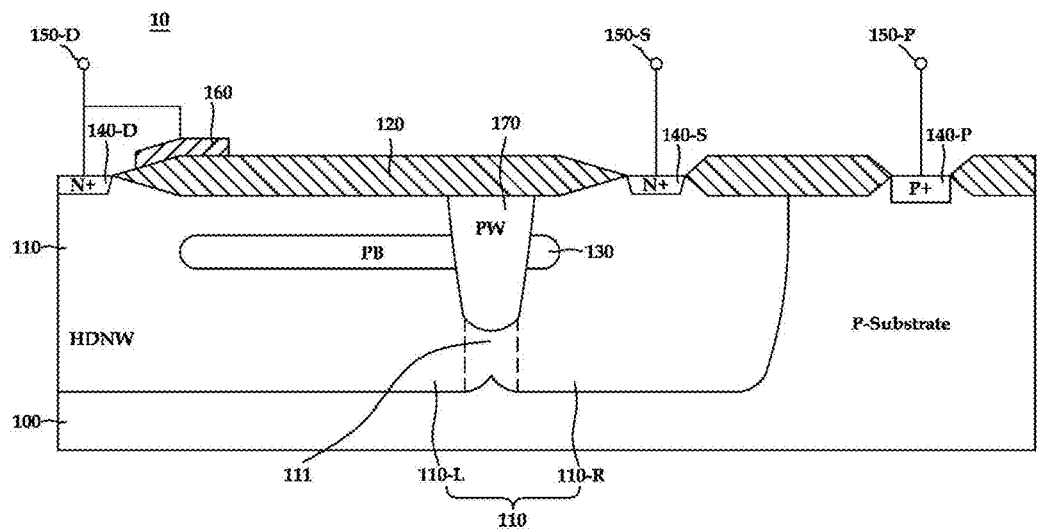
Figure 5B:
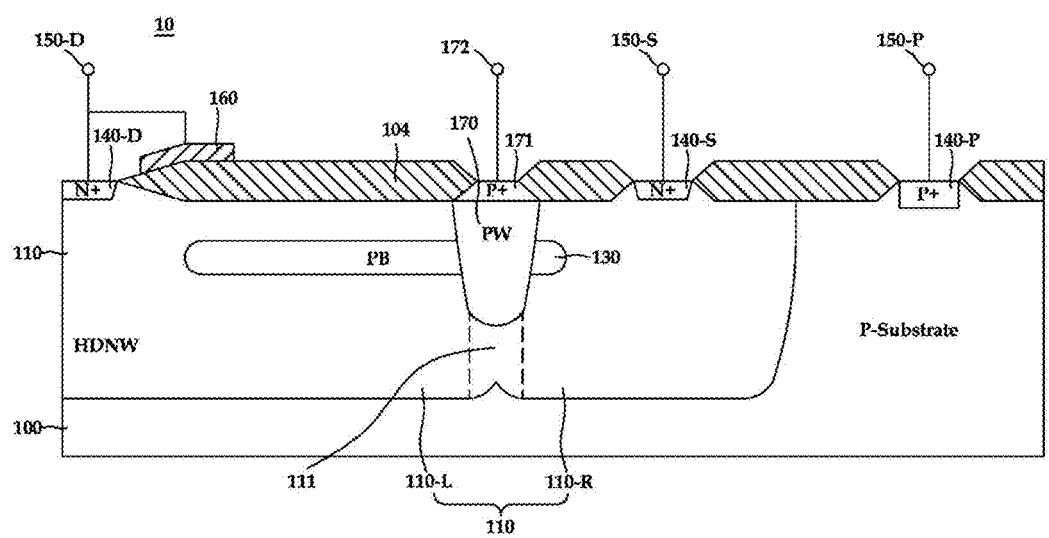

FIGS. 5A-5B illustrate a junction transistor 10 according to an example.

As illustrated in FIG. 5A, the junction transistor 10 according to an example further includes a JFET gate region 170 at an upper part of a groove H. In this example, the JFET gate region 170 is formed on a part of the deep-well region and is formed to be in contact with a lower part of the insulating layer 120 and to pass through the second conductivity type buried impurity layer 130. As aforementioned, the pinch-off voltage is potentially further lowered by the JFET gate region 170. This lowering occurs because a P-type region is further increased by comparison to when only a second conductivity type buried impurity layer 130 is formed. The JFET gate region 170 is a junction gate. Furthermore, when a reverse-bias is applied to the JFET gate region 170, a depletion region becomes extended and comes into contact with a P-type substrate 100. Also, in this scenario, a pinch-off is generated, and a resistance of a deep-well region 110 rapidly increases accordingly. However, when a pinch-off voltage is not reached, a diffusion region 111 below a second conductivity type well 170 becomes a channel region that applies a current.

The JFET gate region 170 is formed on a diffusion region 111 of a junction transistor 10, and thereby reduces the cross-sectional area of the diffusion region 111. In other words, the diffusion region 111 of the junction transistor 10 is reduced in size at the same time that the first conductivity type well 170 is formed, and hence a pinch-off voltage is also potentially reduced. In this example, the JFET gate region 170 is electrically connected with the substrate and includes a reference voltage.

FIG. 5B illustrates a junction transistor 10 according to an example.

As illustrated in FIG. 5B, the junction transistor 10 according to an example further includes a second conductivity type contact region 171 that is formed on the upper part of the JFET gate region 170 and a contact electrode 172.

The JFET gate region 170 and a deep-well region 110 in contact with the JFET gate region 170 are doped with dopants of opposite conductivity types. Thus, a depletion region of a P-N junction is formed. In an example, a voltage is applied to the JFET gate region 170 through a contact electrode 162, and thereby a depletion region formed on a channel region is controlled. Accordingly, a pinch-off voltage of the junction transistor 10 is controlled in this manner. Additionally, according to another example, the JFET gate region 170 is electrically connected with the substrate 100, and thus a reference ground voltage state is provided without applying a bias.

FIGS. 6A-6D illustrate a manufacturing method of a junction transistor according to an example. Referring to the examples of FIGS. 6A-6D, these figures illustrate a manufacturing method of a junction transistor according to an example.

Figure 6A:
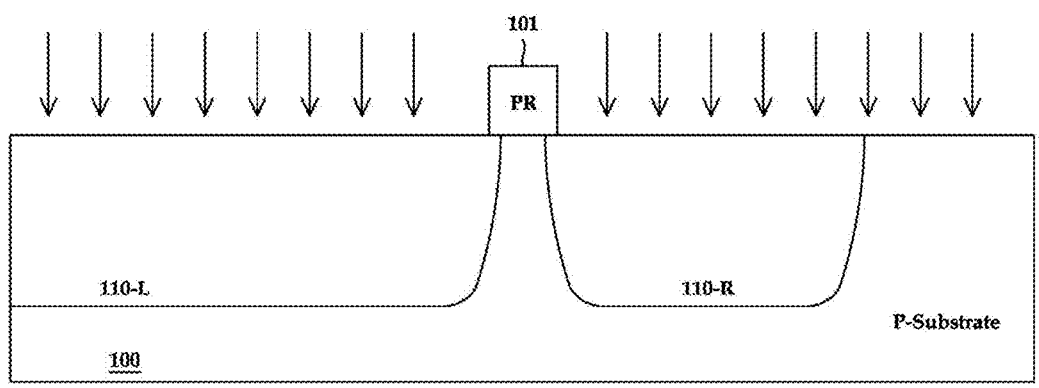

As illustrated in the example of FIG. 6A, in a center of a region that is used as a channel of the junction transistor, a mask pattern 101 with a predetermined width is formed. The mask pattern 101 according to an example is designed for forming a diffusion region 111 with a different concentration from a deep-well region 110 on the deep-well region 110 through a thermal-processing step that is to be discussed further. Here, a region of substrate 100 that is exposed to an impurity doping by a width of a mask pattern 101 is controlled. Furthermore, a doping concentration of the impurity that is injected around the mask pattern 101 by a shadow effect generated during an ion-injection process according to a thickness of a mask pattern 101 varies between different examples. Accordingly, a form and depth of a groove, not shown, that is formed on a deep-well region 110 potentially varies according to a width and thickness of a mask pattern 101.

A first conductivity type impurity ion is injected in a substrate 100 that is exposed to a mask pattern 101. As a result, a first deep-well region 110-L and a second deep-well region 110-R are formed. Also, in an ion-injection process according to an example, the first conductivity type impurity is injected with a concentration of $1 \times 10^{12}$ to $1 \times 10^{13}$ atoms/$cm^2$. Here, the distance between the first deep-well region 110-L and the second deep-well region 110-R is determined based on a width and thickness of a mask pattern 101.

FIG. 6A illustrates a process of forming the first deep-well region 110-L and the second deep-well region 110-R as being doped with an identical impurity concentration and depth. However, as illustrated in FIG. 4, an impurity concentration and depth of the first deep-well region 110-L and the second deep-well region 110-R are potentially formed differently in other examples, and optionally differ or are the same appropriately. In this example, the first deep-well region 110-L has an effect on an electric feature of a high-voltage transistor. Thus, an impurity doping concentration and depth are potentially determined according to electric features required for a high voltage transistor. However, the second deep-well region 110-R has a small effect on electric features of a high voltage transistor. Accordingly, an impurity concentration and depth are controlled according to electric features required for a junction transistor.

Figure 6B:
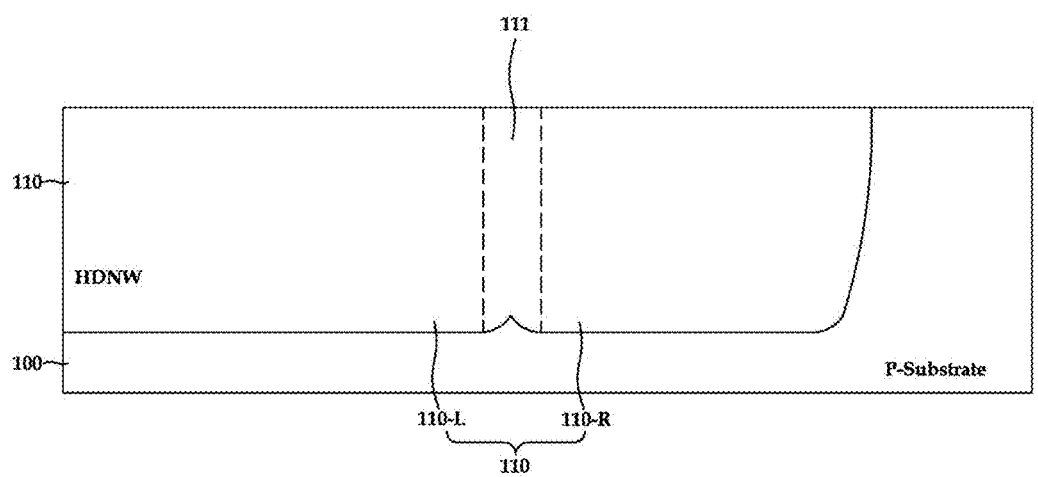

As illustrated in FIG. 6B, the first deep-well region 110-L and the second deep-well region 110-R are in contact with each other as the first conductivity type impurities or dopants are diffused by thermal processing. The thermal processing according to an example proceeds in approximately a time range of 1-15 hours while maintaining a temperature with 1000~1300° C. according to an impurity concentration doped on the first deep-well region 110-L and the second deep-well region 110-R. In this example, the impurity shows an isotropic diffusion characteristic, and thus the upper part of the first deep-well region 110-L and the second deep-well region 110-R show diffusion in a horizontal direction of a substrate surface. However, the lower part further shows diffusion in a vertical direction. Accordingly, a first conductivity type impurity diffusion region is overlapped in the upper boundary, and thus the first deep-well region 110-L and the second deep-well region 110-R are in contact with each other. Thus, a diffusion region 111 is formed between the first deep-well region 110-L and the second deep-well region 110-R. Furthermore, a diffusion region 111 includes a side of the first deep-well region 110-L and the second deep-well region 110-R are thus in contact with each other in this manner. In this example, a concave groove is formed in a lower part of a diffusion region 111 by the sides being in contact with each other.

In this example, the first deep-well region 110-L and the second deep-well region 110-R are formed by separate ion-injection processes. However, in this example, the diffusion region 111 is not formed by a separate ion-injection process. Here, the diffusion region 111 is a region that is formed by a reciprocal diffusion of a dopant in the first deep-well region 110-L and the second deep-well region 110-R. Thus, the diffusion region 111 has an impurity concentration that is lower than that of the first deep-well region 110-L and the second deep-well region 110-R. Further, the depth is also identical to or smaller than the first deep-well region 110-L and the second deep-well region 110-R, since a groove is formed in this example.

Figure 6C:
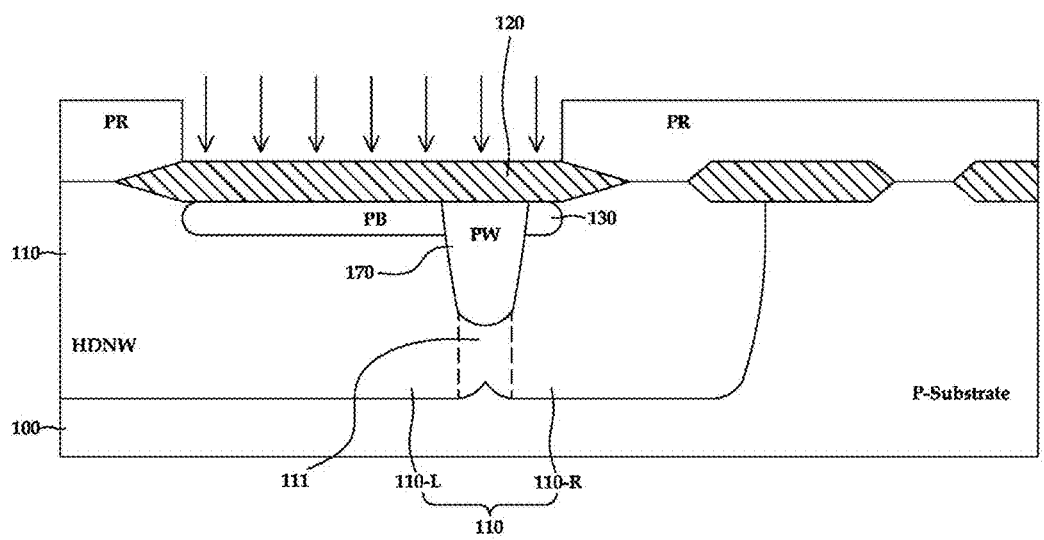

As illustrated in FIG. 6C, when the groove H is formed by thermal processing, an insulating film grows on the substrate 100 surface through a Local Oxidation of Silicon (LOCOS) process or a Shallow Trench Isolation (STI) process. The insulating layer 120 is formed between the drain region, not shown, and a source region, not shown.

Additionally, to form a JFET gate region 170 in a deep-well region 110, the P-type well 170 region is formed by injecting a second conductivity type impurity. In various example, the P-type well 170 region is formed either before or after the insulating layer 120. Further, a buried impurity layer 130 is formed by injecting the second conductivity type impurity into the deep-well region 110. The buried impurity layer 130 is formed while ions pass through the insulating layer 120 during ion-injection. However, almost no damage is applied to the substrate 100 surface because of the insulating layer 120. The buried impurity layer 130 is formed with a predetermined side feature in a horizontal direction of a substrate 100 surface by injecting appropriately with a second conductivity type impurity having an even energy. Furthermore, the buried impurity layer 130 is formed without overlapping with a drain region, not shown, and a source region, not shown, to avoid degradation. For example, the buried impurity layer 130 is formed to extend from the first deep-well region 110-L and to pass through the third deep-well region 111 to the second deep-well region 110-R.

As illustrated in FIG. 6D, on one side end-terminal of an insulating layer 120, the first conductivity type drain region 140-D and the first conductivity type source region 140-S are formed and on another side end-terminal, the second conductivity type substrate pick-up region 140-P is formed. After forming the drain region 140-D, the source region 140-S, the pick-up region 140-P, the drain electrode 150-D and source electrode 150-S, and pick-up electrode 150-P are formed. In an example, a field plate 160 made of a metal or a polysilicon material is formed on an insulating layer 120 that is formed on an upper part of a drift drain region of a high-voltage transistor 20.

FIG. 7 is a diagram illustrating a voltage and current feature curve in a pinch-off state of a junction transistor according to the present examples.

A horizontal axis of the diagram of FIG. 7 indicates a voltage difference in Volts between a vertical axis of a junction transistor 10 and a pick-up electrode 150-P and a vertical axis of the diagram of FIG. 7 indicates a current amount in Amperes flowing through a drain electrode 150-D and a source electrode 150-S according to the voltage. The pick-up electrode 150-P is measured by applying a voltage range of 0-80V to a ground voltage and a drain electrode 150-D.

As illustrated in FIG. 7, there are two test result curves. The right curve is about 58V as a high pinch-off voltage that is higher as compared to the left graph. The right graph corresponds to an example that is formed with a buried impurity layer 130 at a junction transistor 10. However, a JFET gate region 170 is not formed in this example. By contrast, the left graph illustrates an example in which the buried impurity layer 130 and the JFET gate region 170 region are both formed on the junction transistor 10 as illustrated in FIG. 3A. When the JFET gate region 170 is formed, a pinch-off voltage is potentially further lowered. Referring to the left graph, the current amount increases according to the voltage difference of the drain electrode 150-D and the pick-up electrode 150-P and then converges at about 2 mA. Further, the current is blocked at a level of 24V. As a result, the pinch-off voltage reaches the level of about 24V. The aforementioned result is applicable to a low power application that has an effect of reducing the coverage area over 90% as compared to forming a high voltage transistor and a junction transistor that are separately formed for a low power application.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A method for forming a semiconductor device, the method comprising:
providing a substrate;
forming a first deep well region of a first conductivity type in a first portion of the substrate;
forming a second deep well region of the first conductivity type in a second portion of the substrate, the first and second deep well regions being formed with an identical doping concentration and doping depth;
forming a deep diffusion region of the first conductivity type in the substrate between the first deep well region and the second deep well region;
forming a third well region of a second conductivity type in the deep diffusion region, the third well region being a gate region of a junction field effect transistor (JFET) and configured to control a pinch off voltage of the JFET;
forming an insulation layer on a top surface of the substrate;
forming a buried impurity layer of the second conductivity type in the first and second deep well regions, the buried impurity layer being in electrical contact with the third well region;
forming a drain region in the first portion of the substrate; and
forming a source region in the second portion of the substrate, the source region and the drain region being of the first conductivity type.

2. The method of claim 1, further comprising:
forming a pick-up region of the second conductivity type on a third portion of the substrate.

3. The method of claim 1, further comprising:
forming a field plate on the insulation layer, the field plate being in electrical contact with the drain region to prevent a breakdown phenomenon in the semiconductor device.

4. The method of claim 1, wherein the deep diffusion region has a graded doping profile, such that a doping concentration decreases from a first edge near the respective deep well region to a second edge away from the respective deep well region.

5. The method of claim 1, wherein the buried impurity layer has a width that extends beyond the third well region on both sides of the third well region.

6. The method of claim 1, wherein the deep diffusion region is spaced apart from the drain region by a first distance and is spaced apart from the source region by a second distance, and
wherein the first distance is greater than the second distance.

7. The method of claim 1, wherein the deep diffusion region is formed through a thermal processing process that diffuses first conductive type impurities.

8. The method of claim 1, wherein the first conductivity type is an N-type and the second conductivity type is a P-type.

9. A method for forming a semiconductor device, the method comprising:
providing a substrate;
forming a deep well region of a first conductivity type in the substrate, wherein the deep well region comprises a first deep well region of the first conductivity type in a first portion of the substrate, and a second deep well region of the first conductivity type in a second portion of the substrate;
forming a deep diffusion region of the first conductivity type in the substrate between the first deep well region and the second deep well region, the deep diffusion region having a doping concentration that is lower than that of the first and second well regions;
forming an insulation layer on a top surface of the substrate;
forming a buried impurity layer of the second conductivity type in the first and second deep well regions;
forming a drain region in the first deep well region; and
forming a source region in the second deep well region, the source region and the drain region being of the first conductivity type.

10. The method of claim 9, wherein the first and second deep well regions have an identical doping concentration and doping depth with respect to the top surface of the substrate.

11. The method of claim 9, wherein the second deep well region has a shallower doping depth than a doping depth of the first deep well region.

12. The method of claim 9, further comprising:
forming a third well region of a second conductivity type contacting the deep diffusion region and a first surface of the substrate, the third well region being a gate region of a junction field effect transistor (JFET) and configured to control a pinch off voltage of the JFET.

13. The method of claim 9, wherein the deep diffusion region is spaced apart from the drain region by a first distance and is spaced apart from the source region by a second distance, and
wherein the first distance is greater than the second distance.

14. A method for forming a semiconductor device, the method comprising:
forming a deep well region of a first conductivity type on a substrate, the deep well region comprising a diffusion region having a dopant concentration lower than that of the deep well region;
forming a junction field effect transistor (JFET) gate region of a second conductivity type on a portion of the diffusion region, the JFET gate region being configured to control a pinch-off voltage of the JFET;
forming a buried impurity layer of the second conductivity type in the deep well region, the buried impurity layer being in electrical contact with the JFET gate region;
forming a common drain region and a first source region of the first conductivity type on the deep well region; and
forming a second source region of the first conductivity type on a body region of the second conductivity type formed on the substrate.

15. The method of claim 14, further comprising:
forming a first pick-up region of the second conductivity type on the substrate near the deep well region and a second pick-up region of the second conductivity type on the body region of the second conductivity type.

16. The method of claim 14, further comprising:
forming a field plate on the insulation layer,
wherein the field plate is in electrical contact with the common drain region to prevent a breakdown phenomenon in the substrate.

17. The method of claim 14, wherein the diffusion region has a graded doping profile such that a doping concentration decreases from a first edge near the deep well region to a second edge away from the deep well region.

18. The method of claim 14, wherein the deep diffusion region is formed through a thermal processing process that diffuses first conductive type impurities.

* * * * *